United States Patent
Ai et al.

(10) Patent No.: US 6,577,447 B1
(45) Date of Patent: Jun. 10, 2003

(54) MULTI-LENS ARRAY OF A WAVEFRONT SENSOR FOR REDUCING OPTICAL INTERFERENCE AND METHOD THEREOF

(75) Inventors: Chia-Yu Ai, Tucson, AZ (US); Takeshi Asami, Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/692,174

(22) Filed: Oct. 20, 2000

(51) Int. Cl.$^7$ .................... G02B 27/10; G02B 5/04
(52) U.S. Cl. .................. 359/626; 359/621; 359/831
(58) Field of Search .................. 359/626, 621, 359/628, 831, 833, 834; 351/205; 356/139.05; 369/100, 124

(56) References Cited

U.S. PATENT DOCUMENTS

| | | | |
|---|---|---|---|
| 4,326,800 A | * 4/1982 | Fitts ................. 356/139.05 |
| 4,490,039 A | 12/1984 | Bruckler et al. ........... 356/121 |
| 5,233,174 A | 8/1993 | Zmek .................. 250/201.9 |
| 5,463,649 A | 10/1995 | Ashby et al. ............. 372/40 |
| 5,493,391 A | 2/1996 | Neal et al. .............. 356/121 |
| 5,539,718 A | * 7/1996 | Hoshi et al. ............. 369/100 |
| 5,610,897 A | * 3/1997 | Yamamoto et al. ..... 369/124.03 |
| 5,825,476 A | 10/1998 | Abitol et al. ............ 356/124 |
| 5,828,455 A | 10/1998 | Smith et al. ............. 356/515 |
| 5,864,381 A | * 1/1999 | Neal et al. .............. 351/205 |
| 5,912,731 A | 6/1999 | Delong et al. ............ 356/121 |
| 5,936,720 A | 8/1999 | Neal et al. .............. 356/121 |
| 5,936,739 A | 8/1999 | Cameron et al. .......... 356/441 |
| 5,939,716 A | 8/1999 | Neal .................... 250/251 |
| 5,978,085 A | 11/1999 | Smith et al. ............. 356/521 |
| 6,052,180 A | 4/2000 | Neal et al. .............. 356/121 |
| 6,130,419 A | 10/2000 | Neal ................... 250/201.9 |
| 6,184,974 B1 | 2/2001 | Neal et al. .............. 356/121 |

FOREIGN PATENT DOCUMENTS

EP    1079223    2/2001

* cited by examiner

*Primary Examiner*—Georgia Epps
*Assistant Examiner*—Gary O'Neill
(74) *Attorney, Agent, or Firm*—Finnegan, Henderson, Farabow, Garrett & Dunner, L.L.P.

(57) ABSTRACT

A wavefront sensor is provided to determine characteristics of an incoming distorted energy beam. The sensor includes a plurality of multi-lens array and a beam detector, such as a CCD camera. The multi-lens array focuses the energy beam to a multiple focal spots forming a diffraction pattern on the CCD camera. The invention teaches a method to eliminate or substantially reduce a cross talk or interference in measuring the intensity of the focal spots. The beam detector or CCD detects the resulted focal spots and determines the characteristics of the incoming energy beam. The method and wavefront sensor according to this invention can be used in combination with an exposure apparatus in a semiconductor wafer manufacturing process.

36 Claims, 17 Drawing Sheets

MULTI-LENS ARRAY OF A WAVEFRONT SENSOR FOR REDUCING OPTICAL INTERFERENCE AND METHOD THEREOF

BACKGROUND OF THE INVENTION

1. Field of the Invention

This invention relates to a wavefront sensor for reducing optical interference. More particularly, this invention relates to a multi-lens array design of a wavefront sensor that can reduce optical interference. The optical interference occurs because each of a plurality of focal spots formed by the multi-lens array causes a rippling effect which propagates to and interferes with an accurate measurement of neighboring focal spots.

2. Description of the Related Art

Wavefront sensors have been used, for example, in camera focusing technology to measure the distance between an object and a camera by sending out a signal wavefront and to measure the round trip time of such signal wavefront. Knowing the distance, the camera can focus properly. Particularly, wavefront sensors include elements which provide information about phase distortions or aberrations in a received wavefront, and elements which analyze, measure, and provide information signals to correct for the aberrations received in optical wavefronts.

In the laser art, wavefront sensors, such as Shack-Hartman sensors, have been used to measure the phase front quality of an incoming laser beam. The wavefront of incoming beam is defined as a surface that is normal to the local propagation direction of the beam. Wave-aberration polynomial represents the departure of the actual wavefront from a perfect spherical reference surface.

FIG. 1 schematically illustrates a conventional Shack-Hartman sensor 100 including an array of lenses 140, commonly referred to in the micro-optics technology as a multi-lens array (abbreviated to M.L.A.), to focus an incoming beam 120 to form a set of focal spots 150 (shown in FIG. 2) on a detector 130, such as a charge coupled device (CCD) camera. Detector 130 detects focal spots 150 and transmits an output to a measuring unit (not shown). The measuring unit compares the light intensity of various focal spots 150 on detector 130 with a reference beam or with a set of nominal values. Based on the readings of the measuring unit, an adaptive optical system (not shown) then compensates for errors or deviations within the laser or resulting from the atmosphere through which the laser beam travels.

A multi-lens array 140 of conventional sensor 100 may be composed of a plurality of lenses, each having a square or rectangular aperture, arranged in a two-dimension configuration. As shown in FIG. 2, focal spots 150 are formed by multi-lens array 140, each lens having a square configuration, such as illustrated by reference element 144. The distribution of focal spots 150 creates a diffraction pattern spreading widely in both the x and y directions, a square array of 6×6 is shown, and are captured by CCD camera 130. For each lens of multi-lens array 140, a collection area of 9×9 CCD pixels or less, illustrated by reference element 132, is assigned to capture the intensity of the central lobe of the corresponding focal spot 150.

The conventional wavefront sensor 100 often encounters a cross talk problem, i.e., a measurement error in determining the characteristics of the plurality of focal spots. FIGS. 3A and 3B schematically show the cross talk problem. The error occurs because each focal spot 150, for example, focal spot F1, radiates an energy, represented by a wave curve W1, that propagates to and directly interferes with the neighboring focal spots 150, including, for example, focal spot F2, and vice versa, energy wave W2 radiated by focal spot F2 propagates and directly interferes with focal spot F1 and other surrounding focal spots.

When multi-lens array 140 have a square or rectangular aperture configuration, such as schematically shown in FIGS. 2 and 4, focal spots F1 and F2 propagate energy waves W1 and W2, respectively, orthogonally along the x and y axes. The rippling effect of energy wave W2 along the x axis directly interferes with the measurement of intensity level of focal spot F1, and vice versa, the rippling effect of energy wave W1 directly interferes with the measurement of intensity level of focal spot F2. It can be seen that the rippling effects of energy waves W1 and W2 along the y axis also directly interfere with other neighboring focal spots 150.

In light of the foregoing, there is a need for a wavefront sensor which can eliminate or substantially reduce the cross talk problem. Also, the wavefront sensor needs to have a compact design and be insensitive to external disturbances. In addition, it is preferable that the wavefront sensor can be easily manufactured from a conventional lithography system to make the new detector and the multi-lens array.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, a first aspect of the invention is a method for reducing an optical interference in a wavefront sensor. The method comprises the steps of providing a multi-lens array in a two-dimension configuration to focus an incoming wavefront to form a plurality of focal spots, and systematically off-setting portions of the plurality of focal spots to create a staggered two-dimension diffraction pattern.

Another aspect of the present invention is a method for making a wavefront sensor to reduce an optical interference of focal spots. The method comprises the steps of providing a multi-lens array to focus an incoming wavefront to form a plurality of focal spots in a two-dimension configuration, and off-setting predetermined portions of the plurality of focal spots to form a staggered two-dimension diffraction pattern. The method also comprises the step of providing a detector to detect the staggered two-dimension diffraction pattern.

A further aspect of the present invention is a wavefront sensing apparatus, comprising a multi-lens array to focus an incoming wavefront to a plurality of focal spots, the multi-lens array configured to form a staggered two-dimension diffraction pattern to substantially eliminate optical interference, and a detector to detect the staggered two-dimension diffraction pattern.

Yet a further aspect of the present invention is a wavefront sensing apparatus having a multi-lens array to focus an incoming wavefront to form a plurality of focal spots, and a detector to detect the plurality of focal spots. The apparatus comprises a plurality of optical prisms attached to predetermined portions of the multi-lens array, so that corresponding predetermined portions of the plurality of focal spots are systematically off-set to form a staggered diffraction pattern on the detector.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to an embodiment of apparatus and method consistent with the principles of the present invention, examples of which are illustrated in the accompanying drawings. The invention will be further clarified by the following examples, which are intended to be exemplary of the invention.

The method and apparatus consistent with the principles of the present invention can be utilized to eliminate or substantially reduce a cross talk problem, i.e., an optical interference occurring when each of a plurality of focal spots formed by a multi-lens array radiates energy causing a rippling effect which propagates to and interferes with an accurate measurement of the neighboring focal spots. The principles of the present invention solve the cross talk problem by forming a staggered diffraction pattern of the focal spots. The staggered diffraction pattern is formed by systematically off-setting predetermined portions of the focal spots formed by the multi-lens array.

Figure 1:
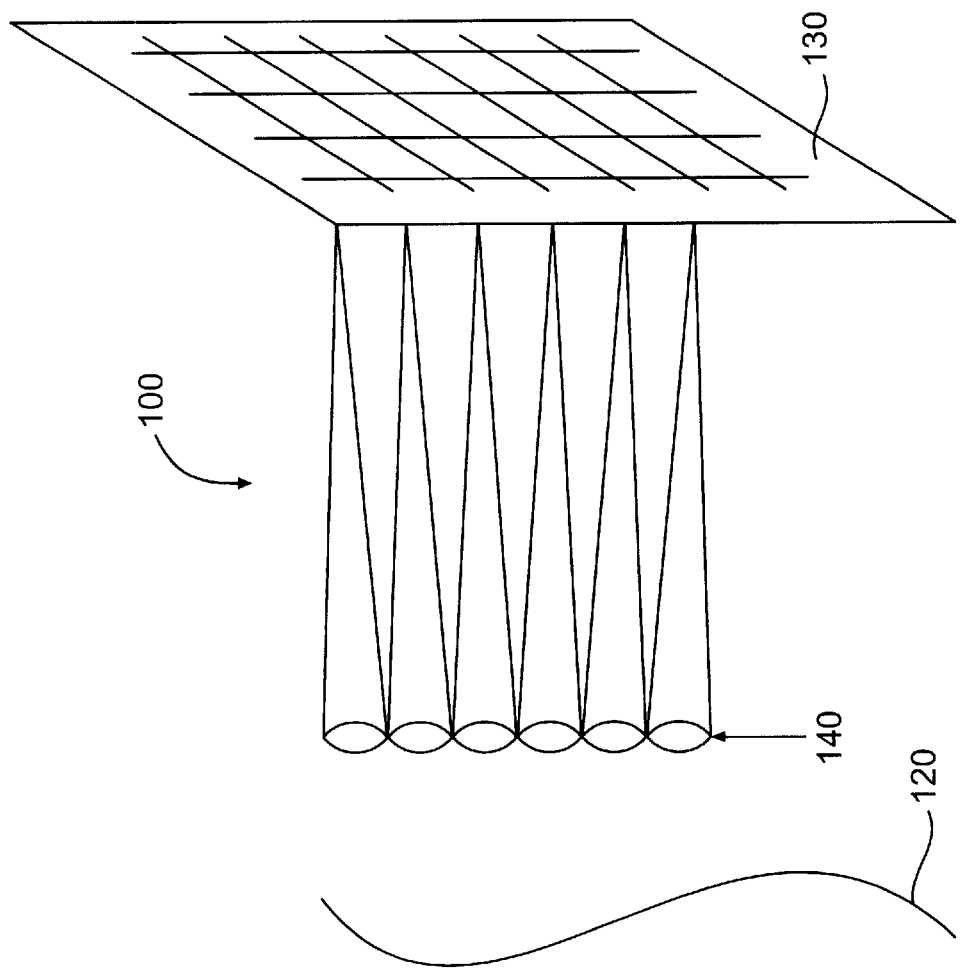
FIG. 1 is a schematic side view of an incoming wavefront entering a conventional wavefront sensor.
Figure 2:
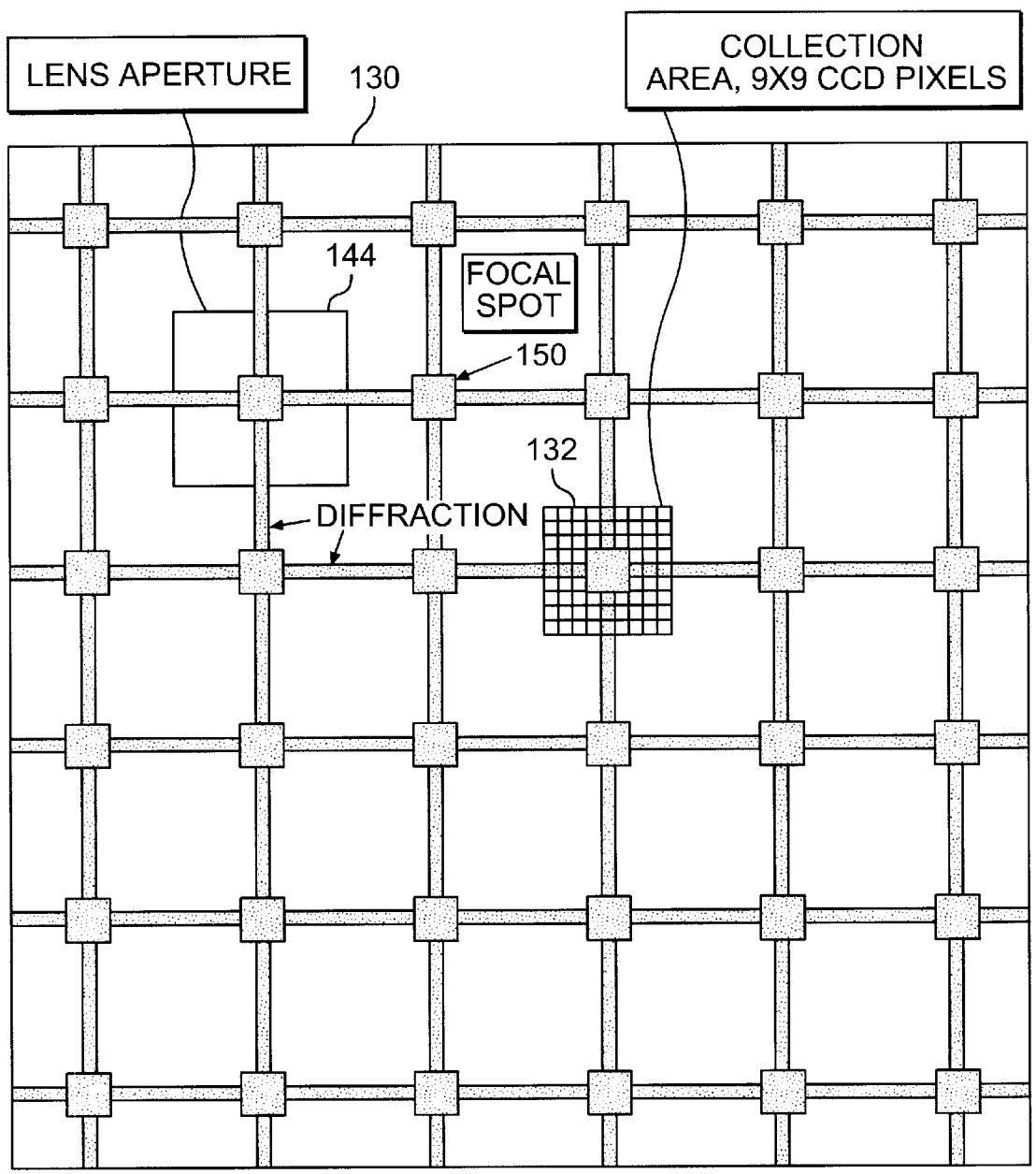
FIG. 2 is a diagram of a diffraction pattern of a plurality of focal spots formed on a CCD camera by the conventional wavefront sensor of FIG. 1.
Figure 2:
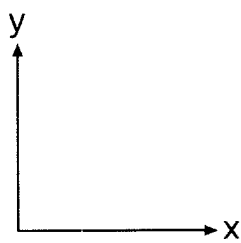
Figure 3A:
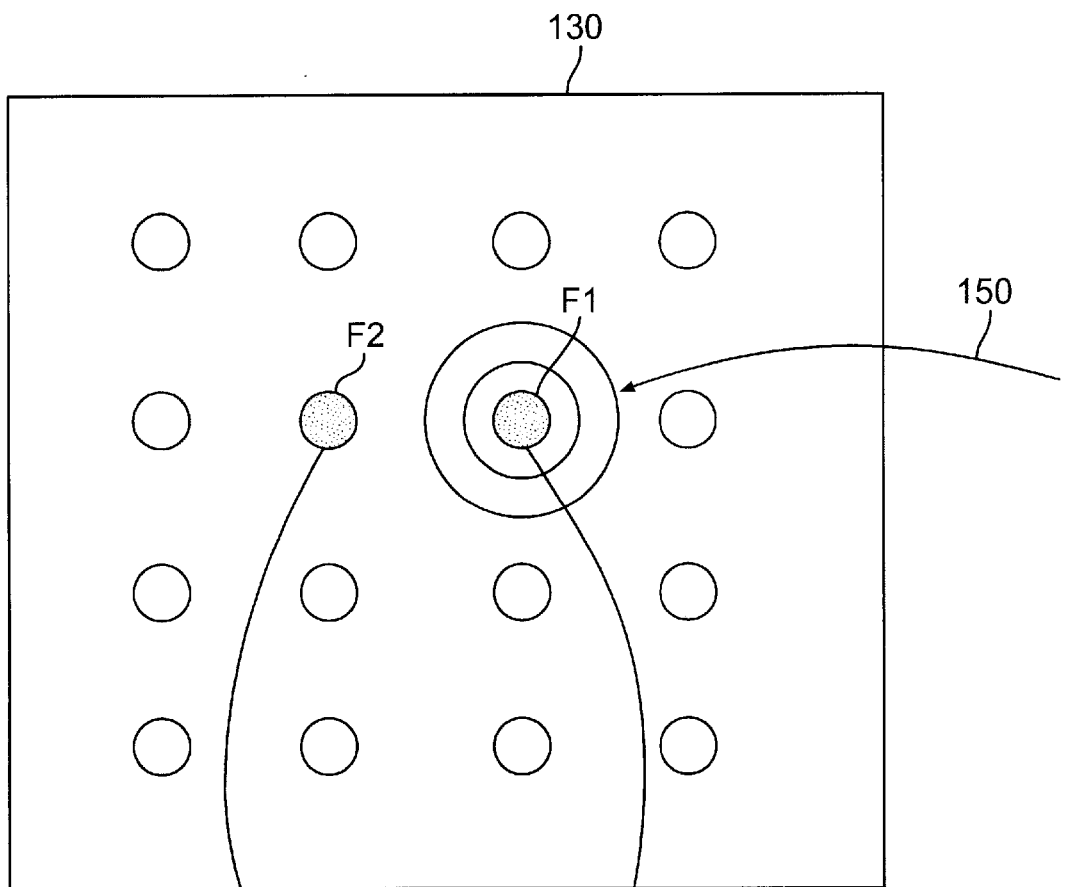
FIG. 3A is a conceptual plan view illustrating a plurality of focal spots formed by a multi-lens array having a circular aperture configuration.
Figure 3B:
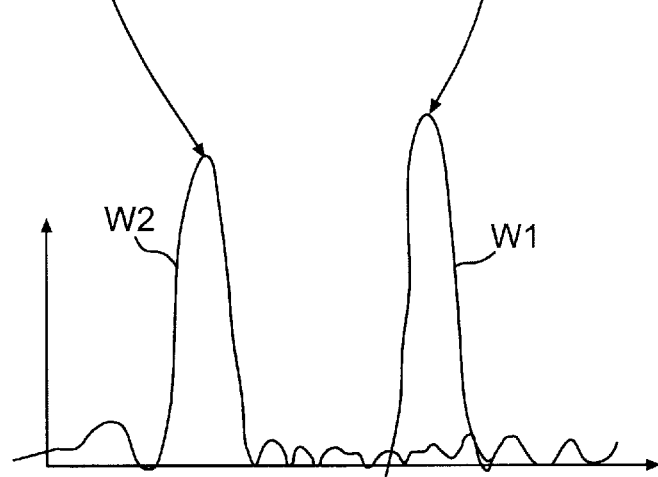
FIG. 3B is a conceptual diagram illustrating a cross talk due to an interference between energy waves radiated by two of the plurality of focal spots shown in FIG. 3A.
Figure 4:
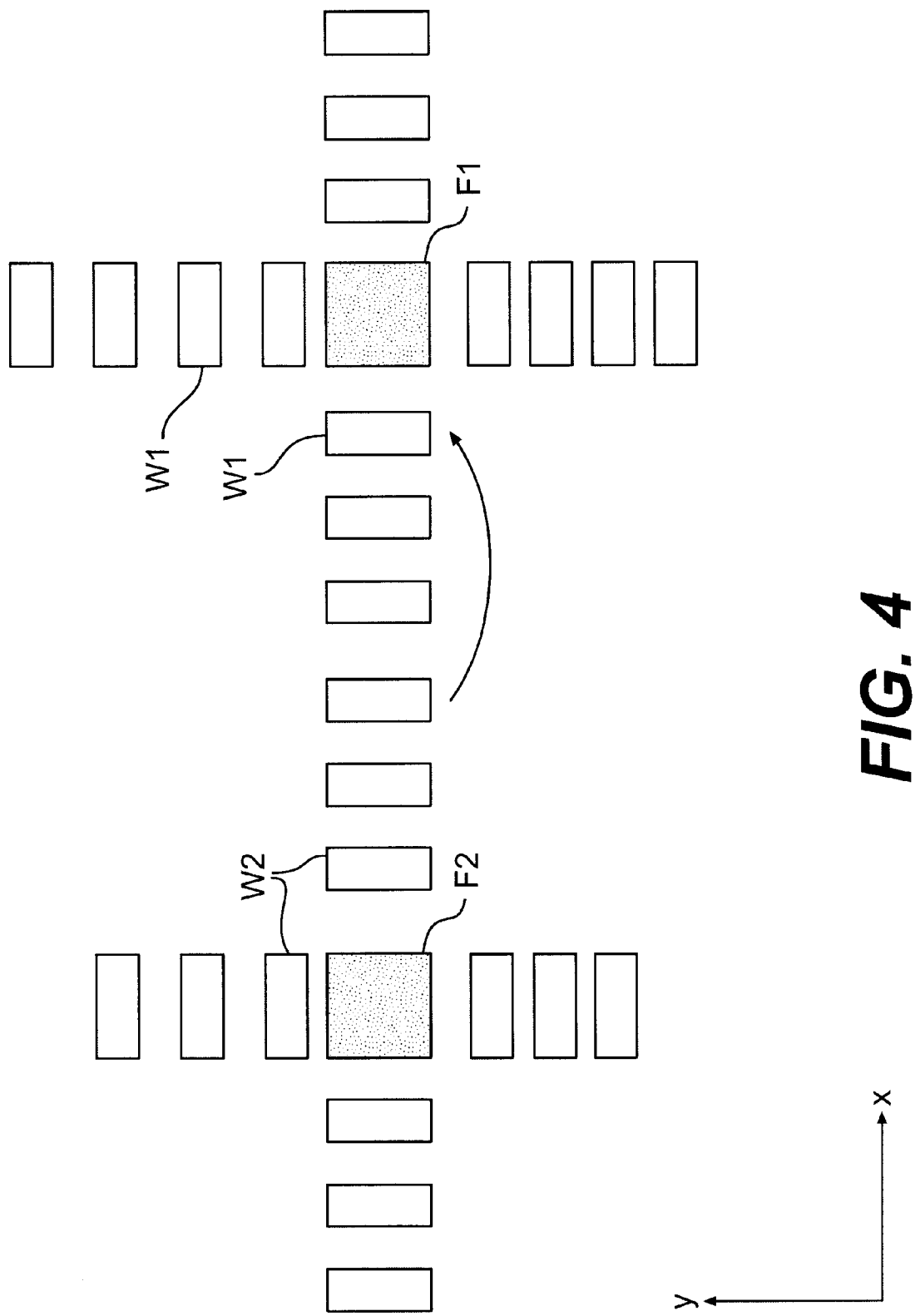
FIG. 4 is a diagram of a cross talk in a multi-lens array having a square aperture configuration.
Figure 5:
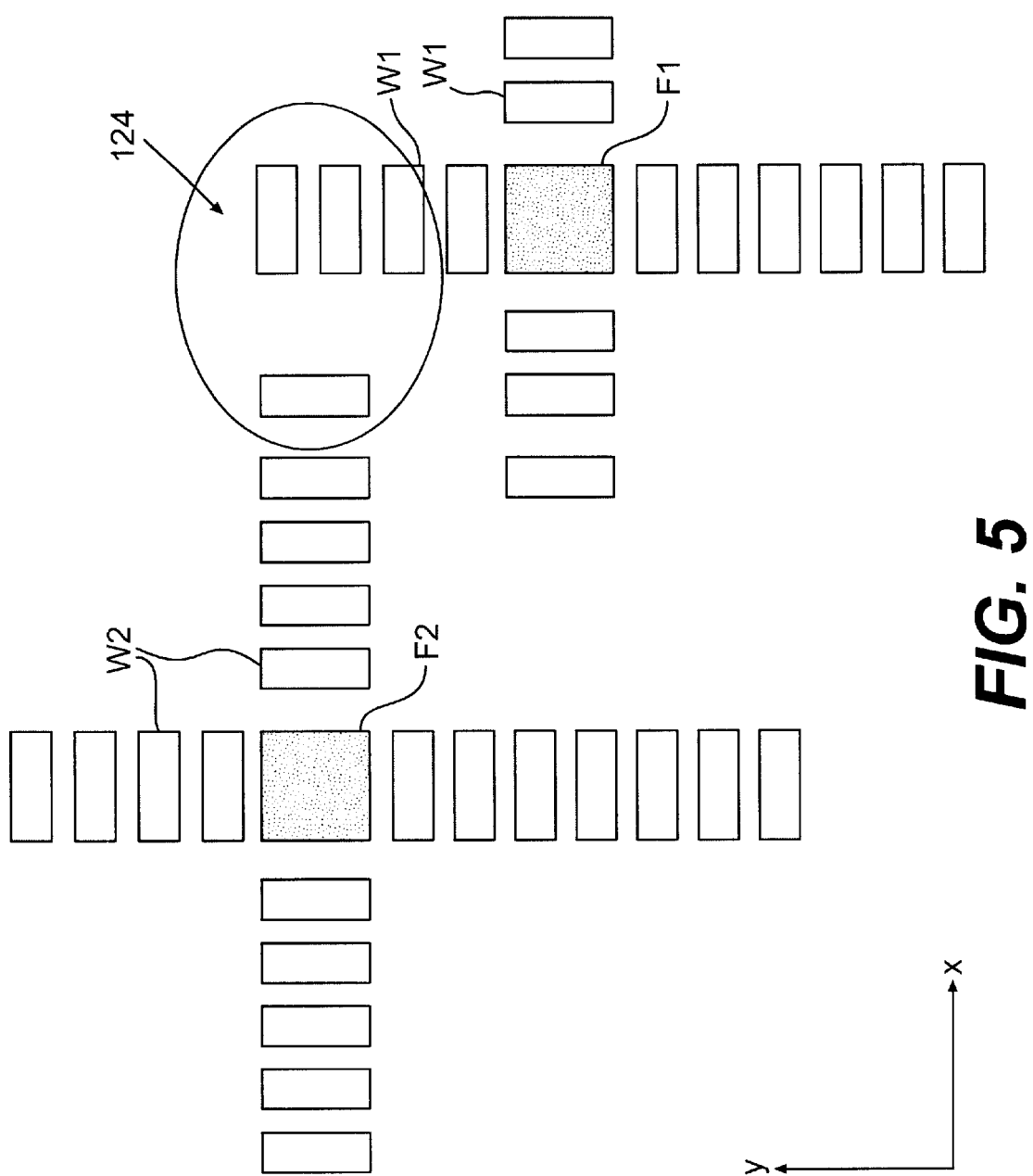
FIG. 5 is a diagram of staggered focal spots formed according to the method consistent with the principles of the present invention.

Consistent with the principles of the present invention, as illustrated in FIG. 5, the cross talk problem can be eliminated or substantially reduced by forming a staggered diffraction pattern of the focal spots. FIG. 5 shows a portion of a diffraction pattern whereby focal spots F1 and F2 are being off-set to avoid direct interference due to propagation of energy waves W1 and W2, respectively. The rippling effects of energy wave W1 along the y axis and energy wave W2 along the x axis cross at area 124 on detector 130, thus, eliminating direct interference with either focal spot F1 or F2. Similarly, it can be seen that by systematically off-setting the focal spots to form the staggered diffraction pattern, direct interference or cross talk problem can be eliminated or substantially reduced.

Figures 6A, 6B:
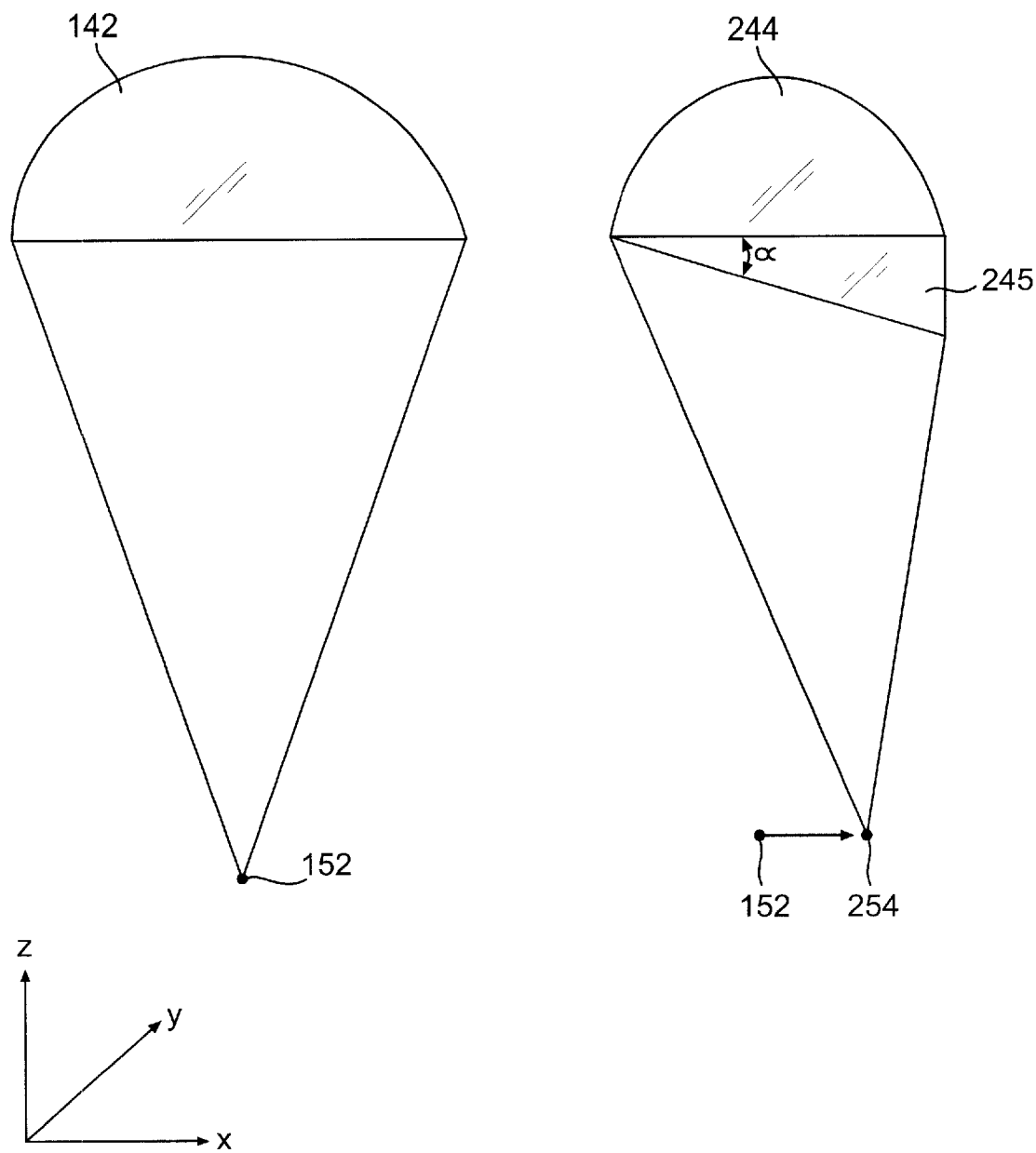
FIG. 6A is a schematic side view of a conventional lens forming a focal spot in the conventional wavefront sensor.
FIG. 6B is a schematic side view of a modified lens consistent with the principles of the present invention forming a shifted focal spot.

The following discusses several structural configurations of multi-lens array 140 to off-set the predetermined portions of the focal spots. FIG. 6A illustrates a conventional lens 142 forming a focal spot 152. FIG. 6B illustrates a lens 244 consistent with the principles of the present invention modified to displace focal spot 152 to focal spot 254 by, for example, attaching an optical prism 245 thereto.

Optical prism 245 is dimensionally configured to form focal spot 254 according to a predetermined distance focal spot 152 is to be off-set or displaced along the x and/or y axes. For example, the angle α, made about the y axis and formed by two legs of prism 245 on the xz plane, as well as the optical properties of prism 245 determine the displacement of focal spot 254 along the x axis. Optical prism 245 is not necessarily, but preferably made of the same material as lens 244, for example, glass, fused silica ($SiO_2$), $BK_7$, silicone (Si), germanium (Ge), or other materials suitable for making lenses. Optical prism 245 can be attached to lens 244 by any conventional means, such as adhesives, mechanical fasteners, or other means. Alternatively, lens 244 and optical prism 245 can also be made an integral lens body.

Figure 7:
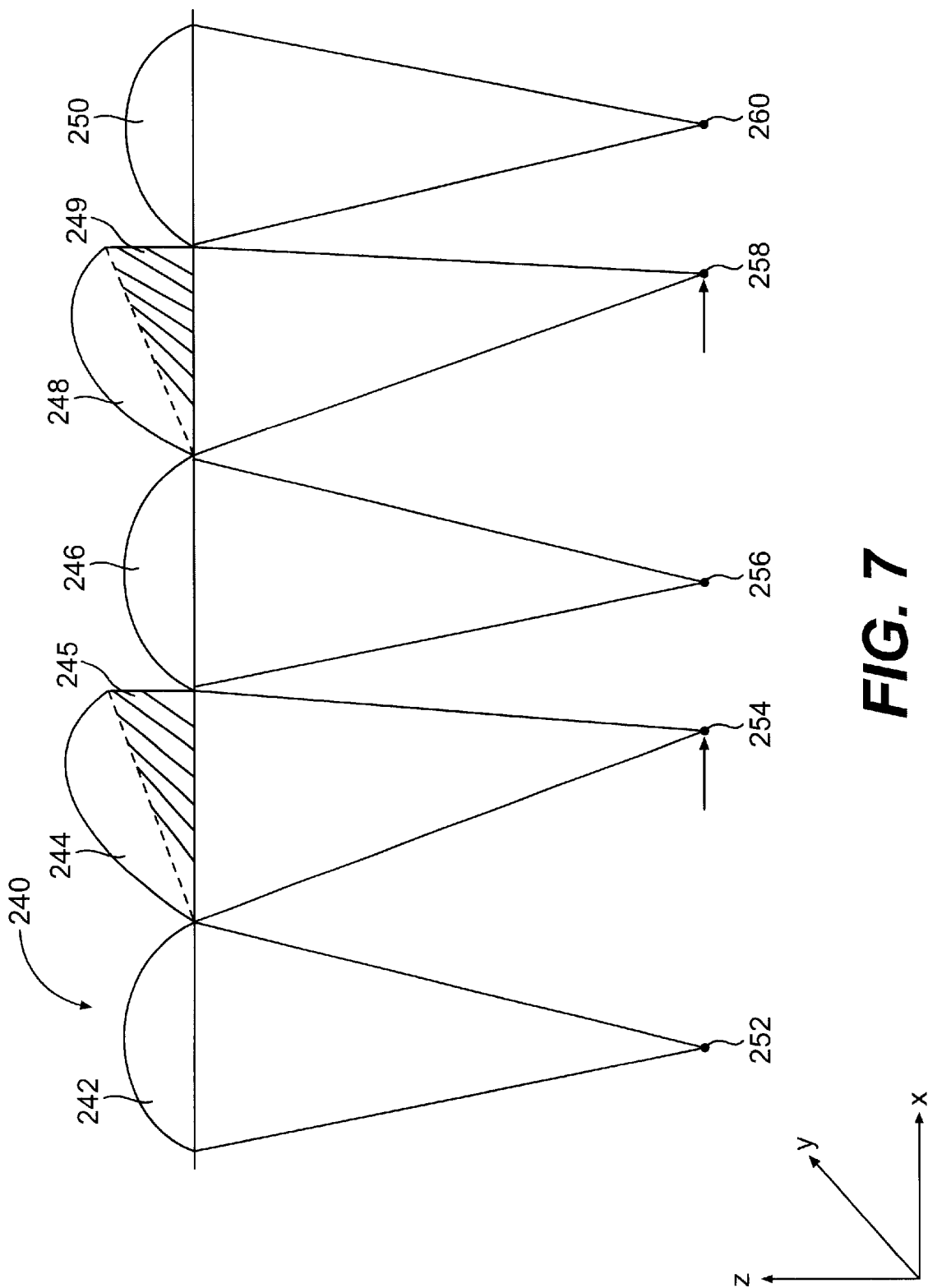
FIG. 7 is a schematic side view of a multi-lens array according to a first embodiment of the present invention having predetermined portions of the multi-lens array modified to shift the focal spots.

FIG. 7 schematically illustrates one embodiment of a multi-lens array 240 consistent with the principles of the present invention. Each row of multi-lens array 240 includes a plurality of serially aligned lenses (five are shown), a set of predetermined portions of them 242, 246, 250, forming focal spots 252, 256, 260, respectively, while another set of predetermined portions of them 244, 248, having optical prisms 245, 249, respectively, attached thereto, forming focal spots 254, 258, respectively.

In one embodiment, optical prisms 245, 249 may have a substantially uniform geometrical structure so that the resulting focal spots 254, 258, respectively, are uniformly off-set by a predetermined distance on the xy plane. Focal spots 254, 258 are shown being off-set by a predetermined distance, for example, along the x axis, corresponding to the structural configuration of optical prisms 245, 249, respectively.

Figure 8:
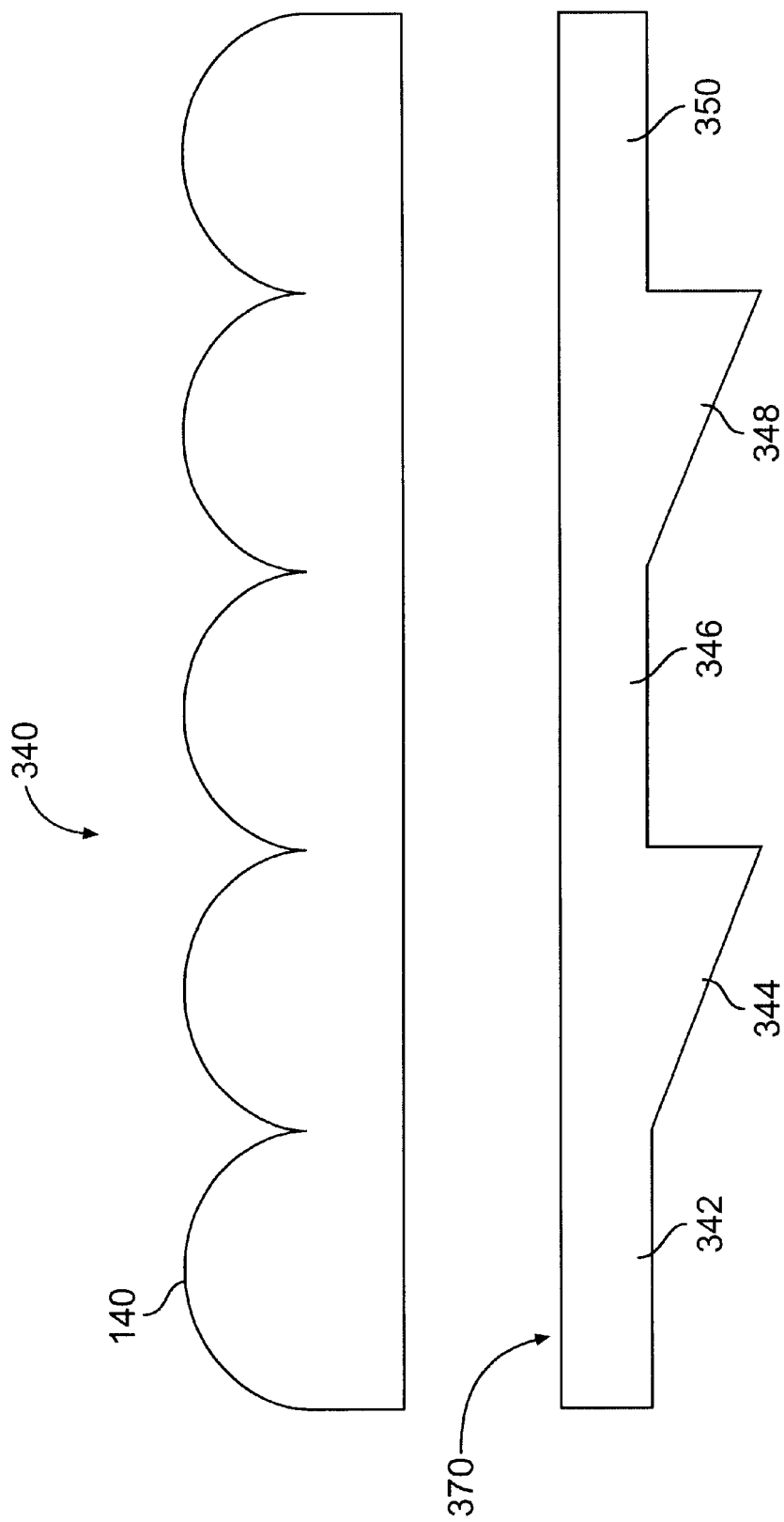
FIG. 8 is a schematic side view of a multi-lens array according to a second embodiment of the present invention having a prism assembly to shift predetermined portions of the focal spots.

FIG. 8 schematically illustrates another embodiment of a multi-lens array 340 consistent with the principles of the present invention including the conventional multi-lens array 140 and a prism assembly 370. Prism assembly 370 has a first set of flat lenses 342, 346, 350, and a second set of prisms 344, 348. Flat lenses 342, 346, 350 combined with corresponding sections of lens array 140, function similar to conventional lenses 242, 246, 250, respectively, shown in FIG. 7, forming nonshifted focal spots (not shown). Optical prisms 344, 348 of prism assembly 370 combined with corresponding other sections of multi-lens array 140, function similar to the combination of optical prisms 244, 245 and 248, 249, respectively, shown in FIG. 7, forming shifted focal spots (not shown). Prism assembly 370 can be attached to multi-lens array 140 by any conventional means, such as adhesives, mechanical fasteners, or other means. Alternatively, multi-lens array 140 and prism assembly 270 can also be made an integral lens assembly.

Figure 9:
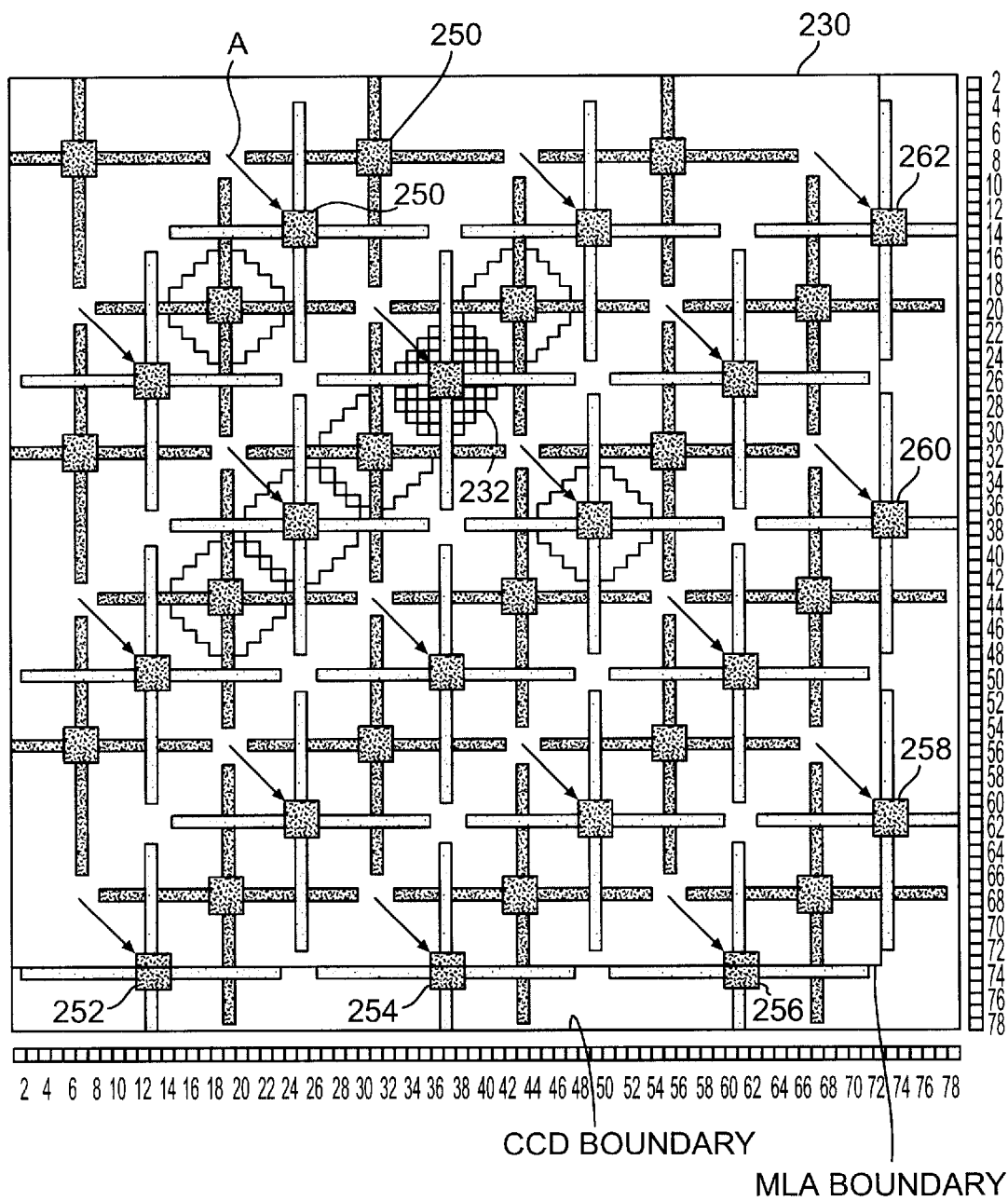
FIG. 9 is a diagram of a first staggered diffraction pattern of a plurality of focal spots formed on a CCD camera utilizing a method consistent with the principles of the present invention.

FIG. 9 illustrates the distribution of focal spots 250, shown as a square array of 6×6, creating a first staggered diffraction pattern consistent with the principles of the present invention to eliminate or substantially reduce the cross talk. Either multi-lens array 240 or 340 may be used to create the first staggered diffraction pattern of FIG. 9. For each lens of the multi-lens array 240 or 340, a collection area of approximately 50 CCD pixels, illustrated by reference element 232, is assigned to capture the intensity of the central lobe of the corresponding focal spot 250.

To create the first staggered diffraction pattern shown in FIG. 9, every other lens element in the multi-lens array 240 or 340 is modified as described above such that the corresponding focal spot formed is diagonally shifted to a lower-right spot at a 45 degree angle. First predetermined portions of focal spots 250, i.e., those at the cross-sections of grey or light color grids, have been displaced, while second predetermined portions at the cross-sections of black or dark color grids remain in place. The plurality of arrows A indicate the displacement of the first predetermined portions of focal spots 250. Similarly, the first predetermined portions of focal spots 250 may be orthogonally shifted along the x and/or y axes to create a different staggered diffraction pattern. Likewise, the first predetermined portions of focal spots 250 may be rotated at any other rotation angle to create another different staggered diffraction pattern.

A larger area of CCD camera 230 is needed to capture the intensity of some of the displaced focal spots, including focal spots 252, 254, 256, 258, 260, and 262, which fall at or adjacent to a boundary of a conventional multi-lens array 140. In this embodiment, CCD camera 230 uses 78×78 pixels to capture the 6×6 array, instead of 72×72 pixels used in the conventional multi-lens array 140.

Figure 10:
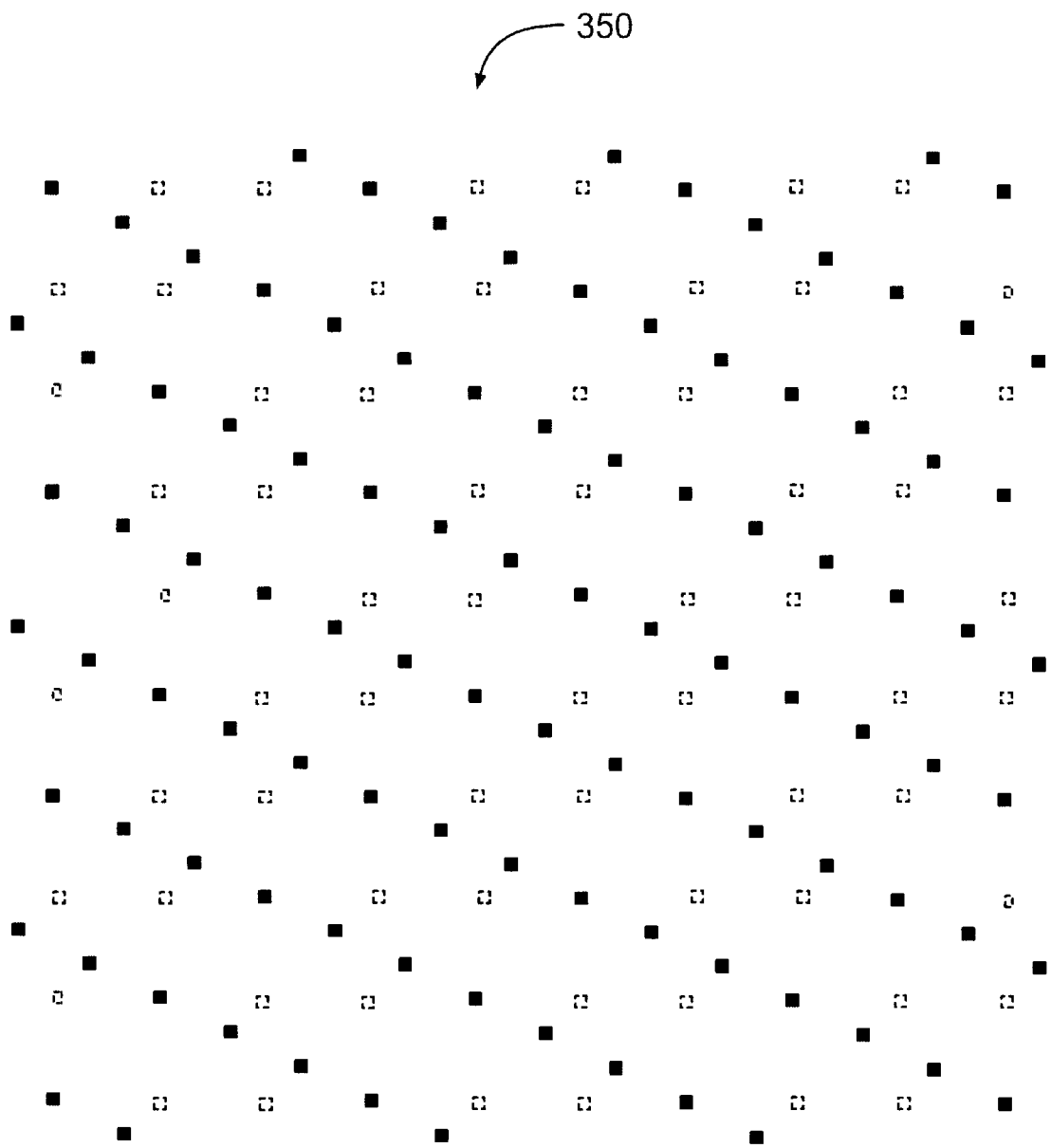
FIGS. 10–12 are diagrams of a second staggered diffraction pattern of a plurality of focal spots formed utilizing the method consistent with the principles of the present invention.
Figure 11:
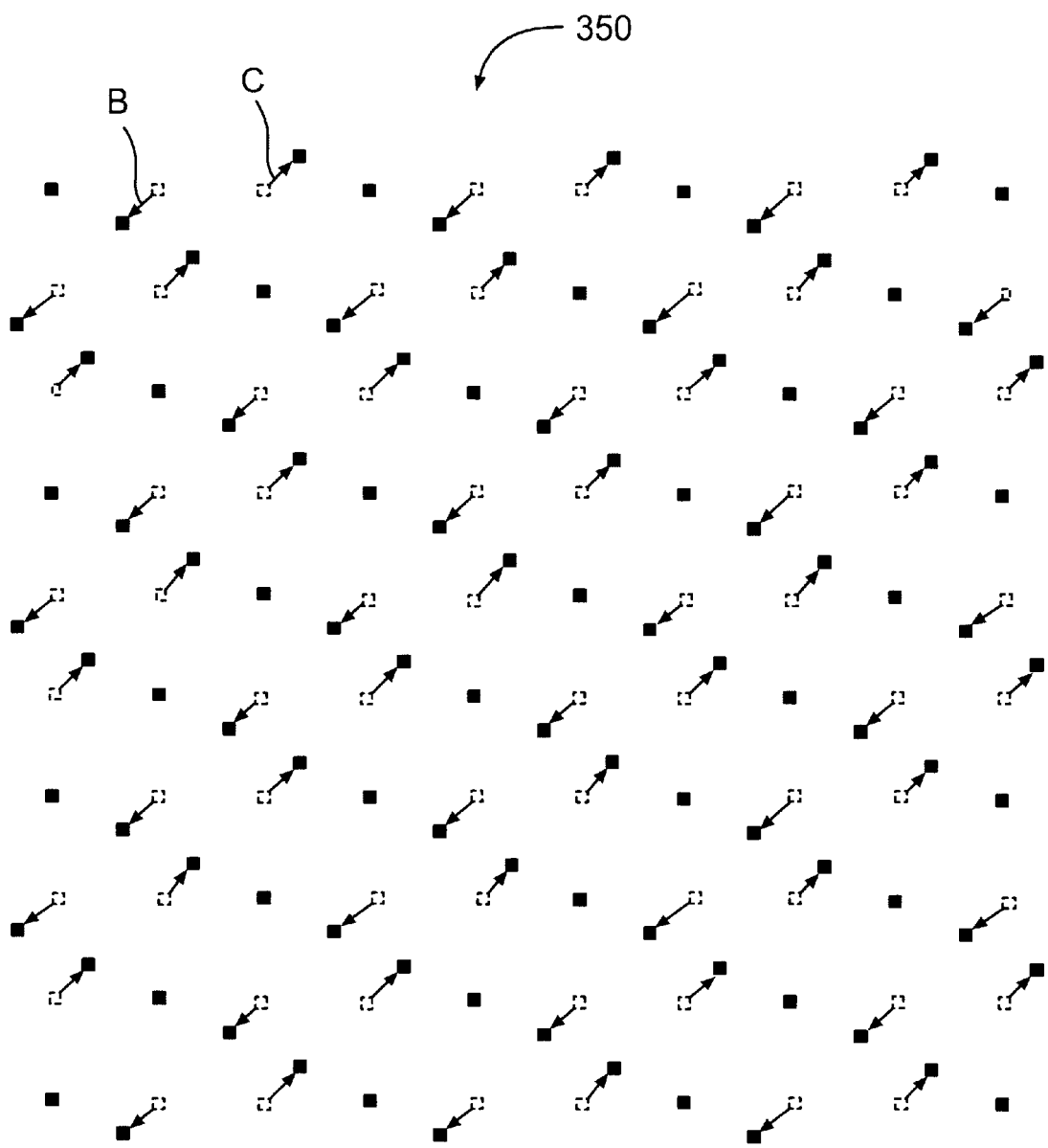
Figure 12:
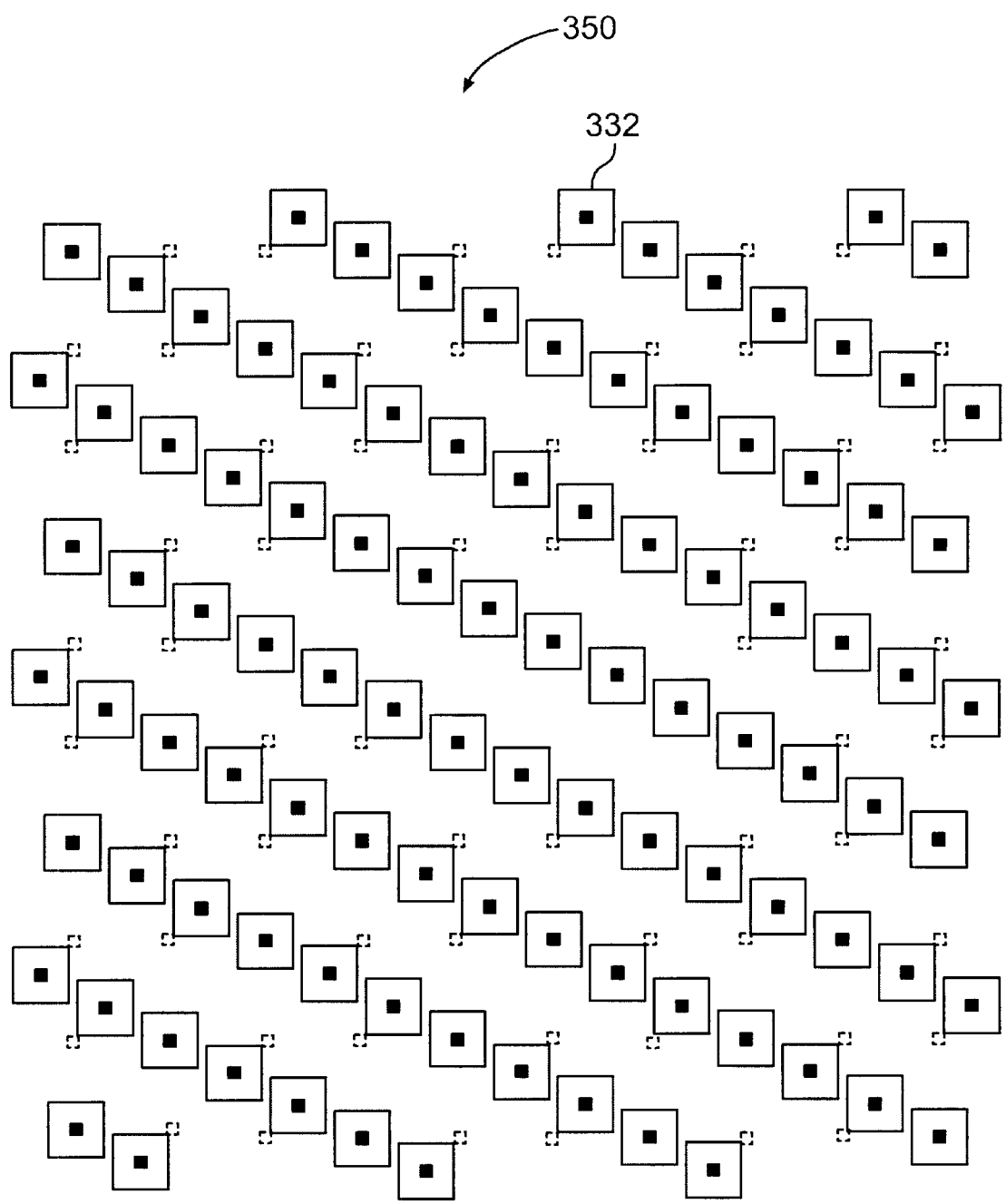

FIG. 10 illustrates the distribution of focal spots 350 creating a second staggered diffraction pattern consistent with the principles of the present invention. A predetermined portion of focal spots 350, those shown as grey or light color spots, have been displaced. FIG. 11 illustrates that, to create the second staggered diffraction pattern shown in FIG. 10, two of every three lens elements in the plurality of multi-lens array 240 or 340 are modified as described above such that the corresponding focal spots formed are shifted; a first one of the two focal spots shifted in a first direction, a second one of the two shifted in a second direction, opposite the first direction. In particular, the first one of the two lens elements may be off-set to a lower-left spot at a 45 degree angle (shown by arrows B), while the second one to an upper-right spot at a 45 degree angle (shown by arrows C). FIG. 12 illustrates the corresponding collection areas 332 assigned to capture the intensity of the central lobe of the plurality of focal spots 350 formed according the second diffraction pattern of focal spots 350.

Figure 13:
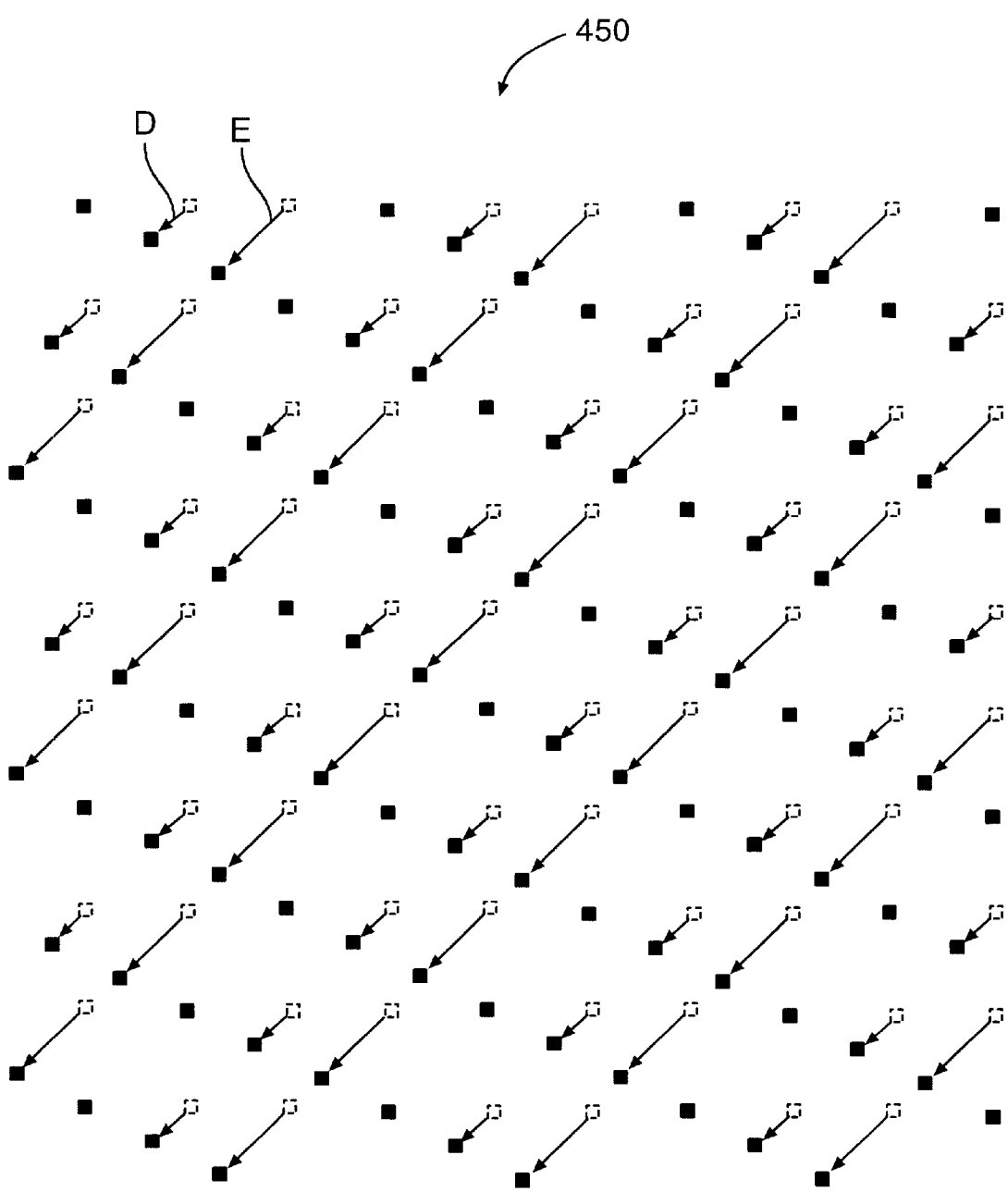
FIG. 13 is a diagram of a third staggered diffraction pattern of a plurality of focal spots formed utilizing the method consistent with the principles of the present invention.

FIG. 13 illustrates the distribution of focal spots 450 creating a third staggered diffraction pattern consistent with the principles of the present invention. A predetermined portion of focal spots 450, those shown as grey or light color spots, have been displaced. To create the third staggered diffraction pattern shown in FIG. 13, two of every three lens elements in the plurality of multi-lens array 240 or 340 are modified as described above such that the corresponding focal spots formed are shifted; both focal spots shifted in one direction, but at difference distances. In particular, the two of every three lens elements have been off-set to a lower-left spot at a 45 degree angle, but a first one of the two lens elements has been displaced by a first distance unit (shown by arrows D), while a second one by a second distance unit (shown by arrows E).

This invention anticipates that other configurations of staggered diffraction patterns may be created consistent with the principles of the present invention. Similarly, other permutation, direction, rotation angle, and displacement unit may be used to off-set predetermined portions of the focal spots formed on the CCD camera. In addition, other techniques may be used to modify the predetermined portions of the multi-lens array to form the staggered diffraction patterns as shown in this application or anticipated in the future.

Figure 14:
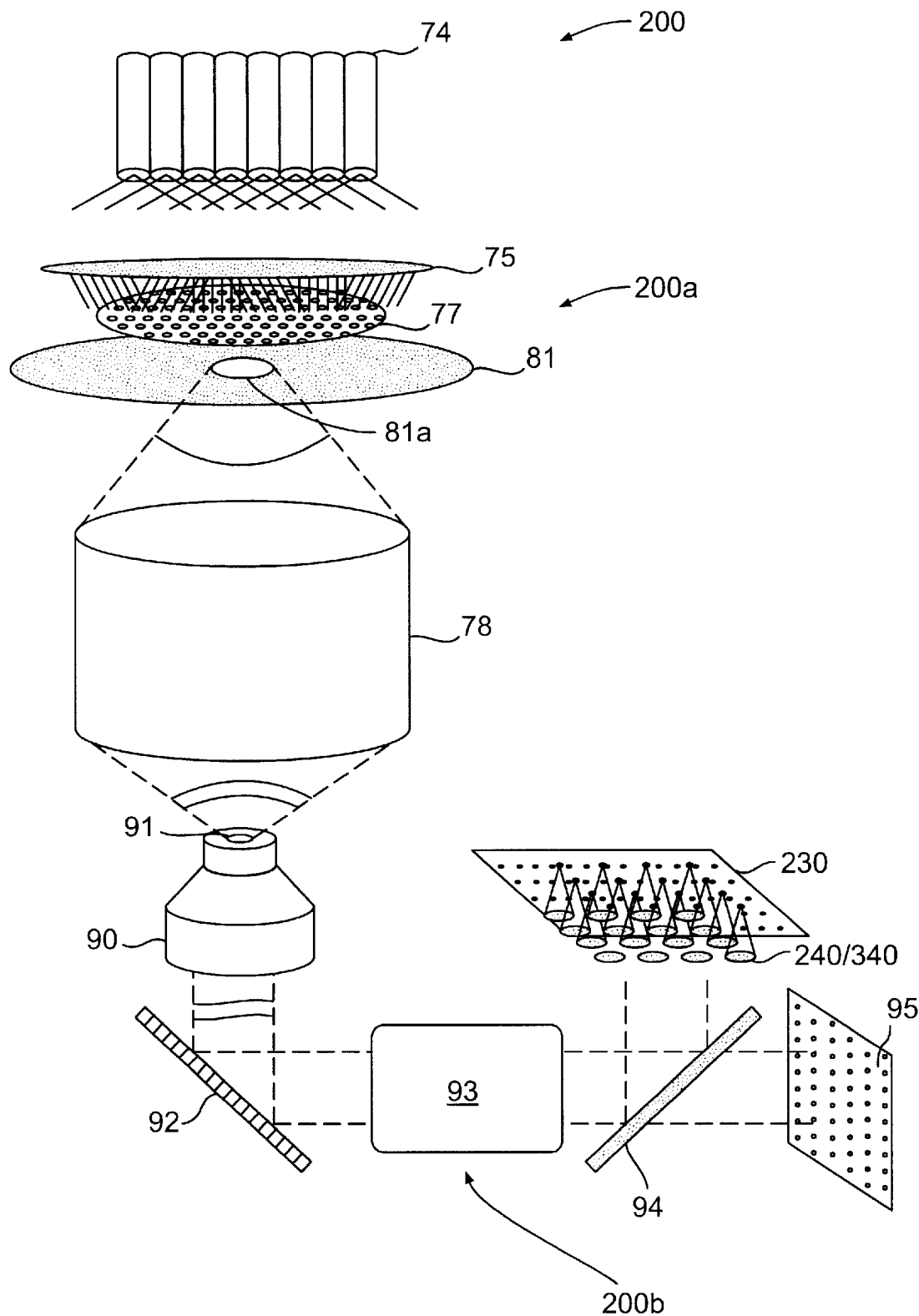
FIG. 14 is an elevation view of a wavefront sensor consistent with the principles of the present invention.
Figure 15:
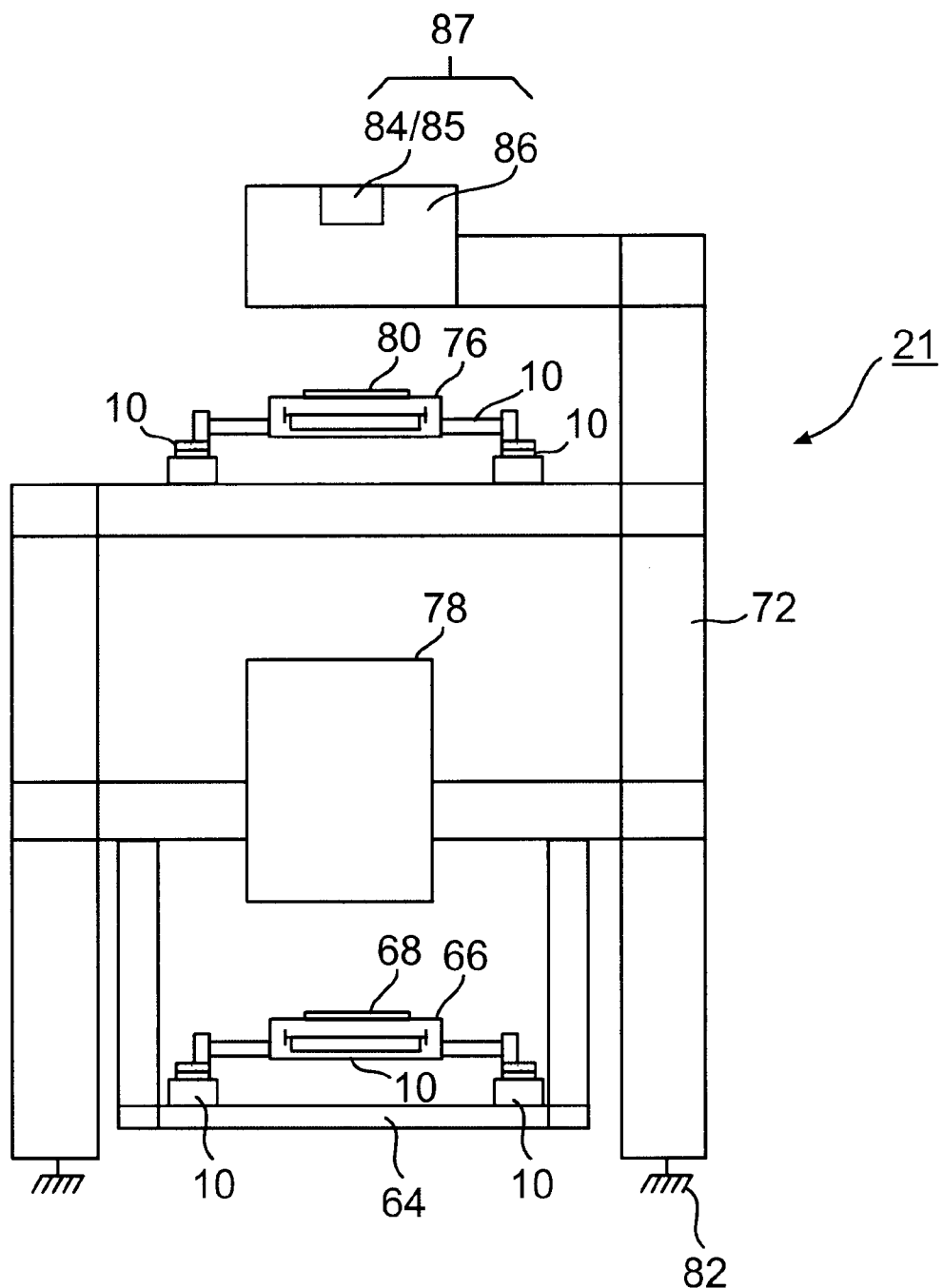
FIG. 15 is an elevation view of an exposure apparatus in which the wavefront sensor consistent with the principles of this invention can be utilized.

FIG. 14 shows a structure of a wavefront sensor 200 consistent with the principles of the present invention which may be incorporated into an exposure apparatus 21 shown in FIG. 15 of a photolithography system to manufacture semiconductor wafers.

As illustrated in FIG. 14, wavefront sensor 200 comprises a first member 200a disposed on the side of an objective plane of lens assembly 78, and a second member 200b disposed on the side of an image plane of lens assembly 78. First member 200a includes a diffuser 77 to diffuse energy beam from a condenser 75 and a test reticle 81. Test reticle 81 has an aperture 81a in approximately the center thereof. Test reticle 81 is generally used to generate a spherical wavefront which is incident onto projection lens assembly 78 to measure the shape of the wave surface of light passing through projection lens assembly 78. Test reticle 81 and diffuser 77 of first member 200a may be mounted on a first support unit (not shown).

Second member 200b includes an objective lens 90, a mirror 92, a relay lens 93, a half mirror 94, and at least one CCD camera. The energy beam entering lens assembly 78 is incident on objective lens 90 via a pinhole 91. Pinhole 91 is disposed on the side of an image plane of lens assembly 78. The energy beam exiting objective lens 90 is reflected off of mirror 92, then passes through relay lens 93. Second member 200b including all elements thereof may be supported in a second support unit (not shown).

In the embodiment shown in FIG. 14, a plurality of focal spots are focused onto CCD 230, while the shape of the pupil of lens assembly 78 is projected onto CCD 95. CCD 95 is disposed conjugate to the pupil of lens assembly 78. CCD 95 detects the bright portion of the pupil of lens assembly 78, i.e., the core of the optical axis of lens assembly 78, from the shape of the pupil of lens assembly 78. The central positions of CCD 230 and CCD 95 are then aligned to match their coordinate positions. The output signals from CCD 230 and CCD 95 are processed to determine characteristics of the incoming energy beam, including the shift in the focusing positions of the spots detected by CCD 230 relative to the bright core.

In an embodiment where wavefront sensor 200 of FIG. 14 is used with exposure apparatus 21 of FIG. 15, when measuring the wavefront of the energy beam as the beam passes through lens assembly 78, first member 200a may be disposed on reticle stage 76, as shown in FIG. 15, while second member 200b may be attached to the side or top of wafer stage 66. Wafer stage 66 is oriented so that pinhole 91 of second member 200b is located on the focusing surface of lens assembly 78.

As illustrated in FIG. 15, in manufacturing integrated circuits using photolithography, energy beam from light source 85 is transmitted through an illumination optical assembly 86 and a reticle 80 carried by a reticle stage 76, and enters a lens assembly 78 of a projection exposure apparatus onto a semiconductor wafer 68 of specially-coated silicon or other semiconductor material. The illumination optical assembly 86 includes a flyeye lens 74 and a condenser 75 (shown in FIG. 14). The uncovered portions of the coating, that are exposed to the energy beam, are cured. The uncured coating is then removed by an acid bath. Thus, the layer of uncovered silicon is altered to produce one layer of the multi-layered integrated circuit. The energy beam may include, for example, any spectrum of light, electron beam, x-ray, and laser beam.

To permit smaller and more intricate circuit patterns, the projection exposure apparatus must accurately focus the energy beam to align the overlay of circuit patterns of the multi-layered integrated circuit. The wavefront sensor consistent with the principles of the present invention helps the projection exposure apparatus to accomplish such precise tolerances by eliminating or substantially reducing cross talk.

The energy beam entering lens assembly 78 passes through an objective lens 90 provided inside lens assembly 78. The wavefront sensor consistent with the principles of the present invention measures the intensity or quality of the wavefront of the energy beam as it travels through a pinhole 91 of objective lens 90. The energy beam is reflected off of a mirror 92, then passes through a relay lens 93. A half mirror 94 is provided adjacent relay lens 93 to transmit a portion of the wavefront to a CCD camera 95 to measure the shape of pupil of lens assembly 78, and to reflect another portion of the wavefront to multi-lens array 240 or 340 to measure the wavefront quality or characteristics consistent with the principles of the present invention.

FIG. 15 illustrates exposure apparatus 21 mounted to a base 82, i.e., a floor or the ground or some other supporting structure. Apparatus frame 72 is rigid and supports the components of exposure apparatus 21. The design of apparatus frame 72 may vary to suit the design requirements of exposure apparatus 21. Apparatus frame 72 supports reticle stage 76, wafer stage 66, lens assembly 78, and illumination system 87 above base 64. Alternatively, for example, separate, individual structures (not shown) can be used to support wafer stage 66 and reticle stage 76, illumination system 87, and lens assembly 78 above base 64.

Illumination system 87 includes illumination source 84 and illumination optical assembly 86. Illumination source 84 emits the beam (irradiation) of light energy. Illumination optical assembly 86 guides the beam of light energy from illumination source 84 to lens assembly 78. The beam illuminates selectively different portions of reticle 80 and exposes wafer 68. The reticle 80 contains a circuit pattern thereon. In FIG. 7, illumination source 84 is illustrated as being supported above reticle stage 76. Typically, however, illumination source 84 is secured to one of the sides of apparatus frame 72 and the energy beam from illumination source 84 is directed to above reticle stage 76 with illumination optical assembly 86.

Lens assembly 78 projects and/or focuses the light passing through reticle 80 to wafer 68. Depending upon the design of apparatus 21, lens assembly 78 can magnify or reduce the image illuminated on reticle 80. Lens assembly 78 can also be a 133 magnification system.

Wafer stage 66 is stabilized so that the leveling shift problem and the rotational problem are substantially reduced as previously discussed in detail. The principles of the present invention also apply to reticle stage 76 in positioning reticle 80.

Reticle stage 76 holds and precisely positions reticle 80 relative to lens assembly 78 and wafer 68. Somewhat similarly, wafer stage 66 holds and positions wafer 68 with respect to the projected image of the illuminated portions of reticle 80. In the embodiment illustrated in FIG. 7, wafer stage 66 and reticle stage 76 are positioned by a plurality of motors 10. Depending upon the design, apparatus 21 can also include additional servo drive units, linear motors and planar motors to move wafer stage 66 and reticle stage 76.

There are several different types of photolithographic devices. For example, exposure apparatus 21 can be used as a scanning type photolithography system which exposes the pattern from reticle 80 onto wafer 68 with reticle 80 and wafer 68 moving synchronously. In a scanning type lithographic device, reticle 80 is moved perpendicular to an optical axis of lens assembly 78 by reticle stage 76 and wafer 68 is moved perpendicular to an optical axis of lens assembly 78 by wafer stage 66. Scanning of reticle 80 and wafer 68 occurs while reticle 80 and wafer 68 are moving synchronously.

Alternatively, exposure apparatus 21 can be a step-and-repeat type photolithography system that exposes reticle 80 while reticle 80 and wafer 68 are stationary. In the step and repeat process, wafer 68 is in a constant position relative to reticle 80 and lens assembly 78 during the exposure of an individual field. Subsequently, between consecutive exposure steps, wafer 68 is consecutively moved by wafer stage 66 perpendicular to the optical axis of lens assembly 78 so that the next field of semiconductor wafer 68 is brought into position relative to lens assembly 78 and reticle 80 for exposure. Following this process, the images on reticle 80 are sequentially exposed onto the fields of wafer 68 so that the next field of semiconductor wafer 68 is brought into position relative to lens assembly 78 and reticle 80.

However, the use of exposure apparatus 21 provided herein is not limited to a photolithography system for a semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 84 can be g-line (436 nm), i-line (365 nm), KrF excimer laser (248 nm), ArF excimer laser (193 nm) and $F_2$ laser (157 nm). Alternatively, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to lens assembly 78, when far ultra-violet rays such as the excimer laser is used, glass materials such as quartz and fluorite that transmit far ultra-violet rays is preferably used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No. 10-3039 and its counterpart U.S. patent application Ser. No. 873,606 (Application Date: Jun. 12, 1997) also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. No. 5,623,853 or U.S Pat. No. 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be released mechanically to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 16:
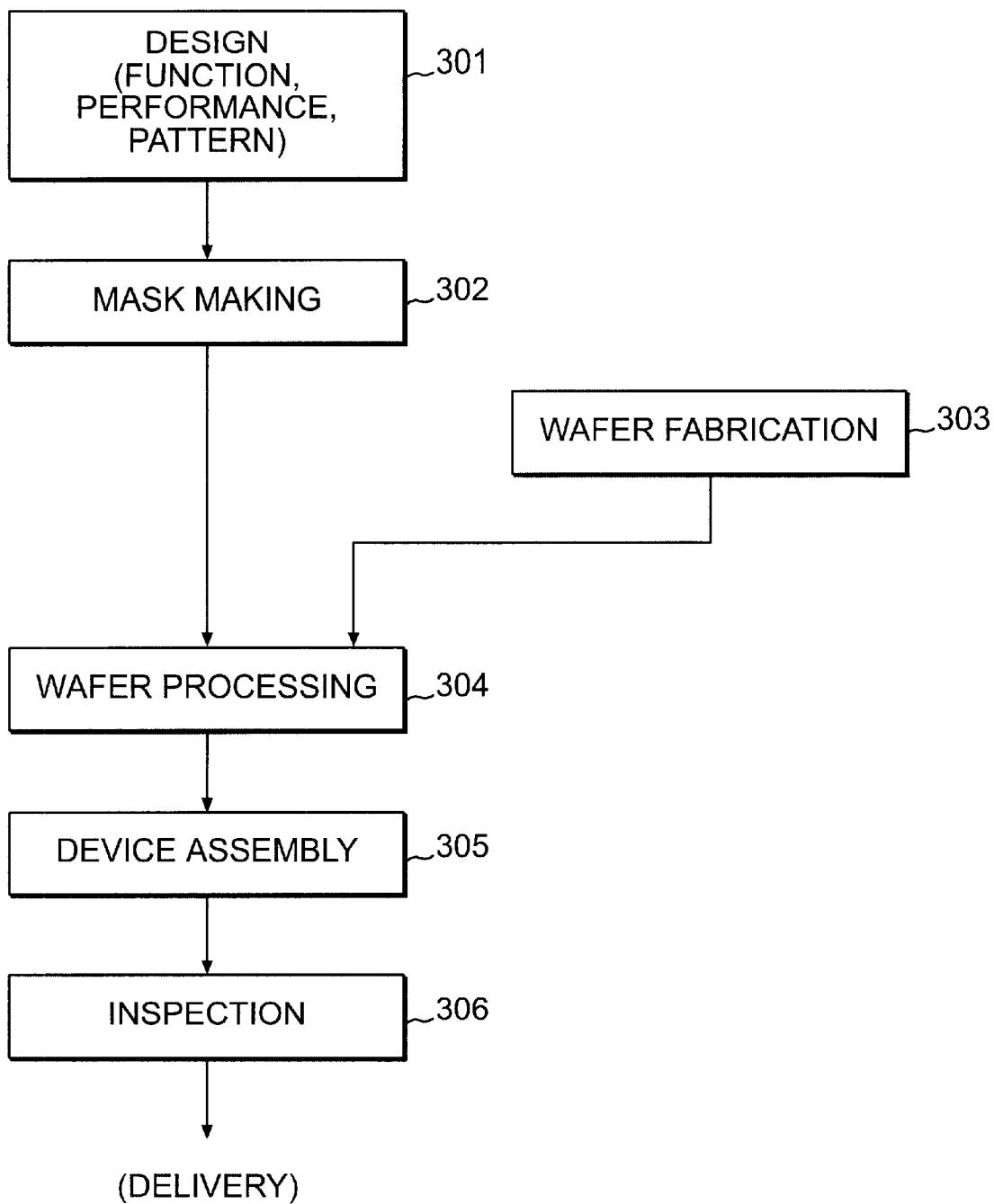
FIG. 16 is a flow chart outlining a process for manufacturing a semiconductor wafer consistent with the principles of the present invention.

Further, semiconductor devices can be fabricated using the above described systems, by the process shown generally in FIG. 16. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 17:
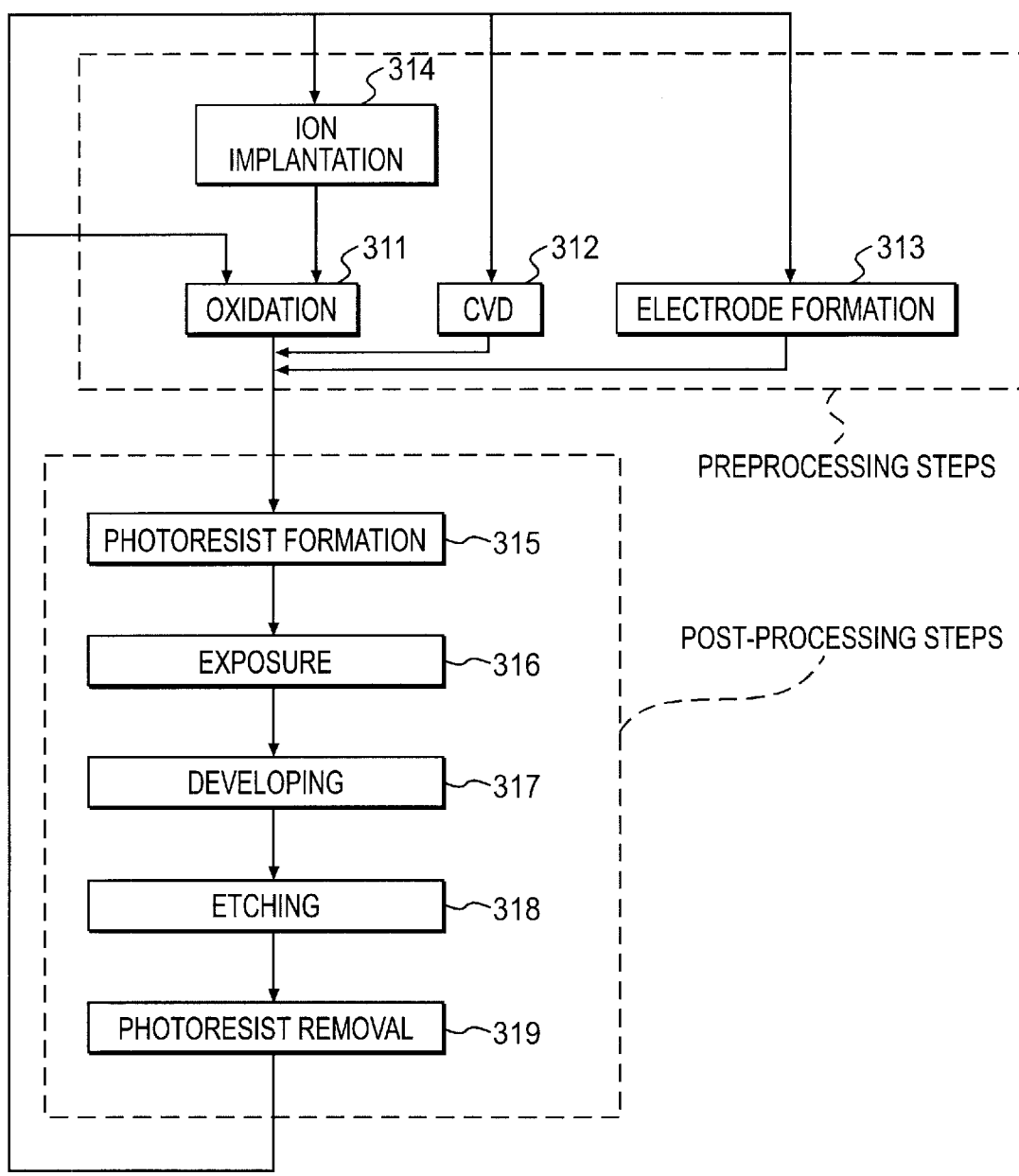
FIG. 17 is a flow chart outlining the semiconductor manufacturing process in further detail.

FIG. 17 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the staggered diffraction pattern, the multi-lens array to form the staggered diffraction pattern, and the methods described, the material chosen for the present invention, and in construction of the multi-lens array, the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

We claim:

1. A method for reducing an optical interference in a wavefront sensor, comprising the steps of:
   providing a multi-lens array in a two-dimension configuration;
   focusing an incoming wavefront with the multi-lens array to form a plurality of focal spots; and
   systematically off-setting portions of the plurality of focal spots to create a staggered two-dimension diffraction pattern to reduce an optical interference between focal spots, wherein the step of systematically off-setting further comprises:
      modifying portions of the multi-lens array corresponding to the portions of the plurality of focal spots to create the staggered two-dimension diffraction pattern, the modified portions of the multi-lens array shifting the portions of the plurality of focal spots, wherein the modifying step of further comprises:
         attaching a prism to each of the modified portions of the multi-lens array, each prism having a configuration to form one of the portions of the plurality of focal spots to create the staggered two-dimension diffraction pattern.

2. The method of claim 1, wherein each lens of the multi-lens array has one of a square and a rectangular aperture.

3. A method for reducing an optical interference in a wavefront sensor, comprising the steps of:
   providing a multi-lens array in a two-dimension configuration;
   focusing an incoming wavefront with the multi-lens array to form a plurality of focal spots; and
   systematically off-setting portions of the plurality of focal spots to create a staggered two-dimension diffraction pattern to reduce an optical interference between focal spots, wherein the step of systematically off-setting further comprises:
      modifying portions of the multi-lens array corresponding to the portions of the plurality of focal spots to create the staggered two-dimension diffraction pattern, the modified portions of the multi-lens array shifting the portions of the plurality of focal spots, wherein the modifying step further comprises:
         attaching a prism assembly across the multi-lens array, the prism assembly having a configuration to form the plurality of focal spots creating the staggered two-dimension diffraction pattern.

4. The method of claim 2, wherein the step of systematically off-setting further comprises:
   shifting every next one of the plurality of focal spots to optimally create the staggered two-dimension diffraction pattern.

5. The method of claim 4, wherein the diagonally shifting step further comprises:
   uniformly shifting every next one of the plurality of focal spots in a diagonal direction.

6. The method of claim 2, wherein the step of systematically off-setting further comprises:
   shifting two of every three of the plurality of focal spots to optimally create the staggered two-dimension diffraction pattern.

7. The method of claim 6, wherein the shifting step further comprises:
   uniformly shifting the two of every three of the plurality of focal spots in a first direction, a first of the two being shifted at a different distance than a second of the two.

8. The method of claim 6, wherein the shifting step further comprises:
   alternately shifting the two of every three of the plurality of focal spots, a first of the two in a second direction, a second of the two in a third direction, opposite from the second direction.

9. An object on which an image has been formed by the method for reducing interference in a multi-lens array of claim 1.

10. A projection lens assembly utilizing the method for reducing interference in a multi-lens array of claim 1.

11. A lithography system utilizing the method for reducing interference in a multi-lens array of claim 1.

12. A method for making a wavefront sensor to reduce an optical interference of focal spots, comprising the steps of:
   providing a multi-lens array;
   focusing an incoming wavefront with the multi-lens array to form a plurality of focal spots;
   off-setting predetermined portions of the plurality of focal spots to form a staggered two-dimension diffraction pattern to reduce an optical interference between focal spots; and
   providing a detector to detect the staggered two-dimension diffraction pattern, wherein the off-setting step further comprises:
      modifying predetermined portions of the multi-lens array corresponding with the predetermined portions of the plurality of focal spots to form the staggered two-dimension diffraction pattern, wherein the modified predetermined portions of the multi-lens array orthogonally shift the predetermined portions of the plurality of focal spots.

13. The method of claim 12, wherein each lens of the multi-lens array has one of a square and a rectangular aperture.

14. An object on which an image has been formed by the method for making a wavefront sensor of claim 12.

15. A projection lens assembly utilizing the method for making a wavefront sensor of claim 12.

16. A lithography system utilizing the method for making a wavefront sensor of claim 12.

17. A wavefront sensing apparatus, comprising:
a multi-lens array comprising at least one optical prism associated with a respective lens, wherein the multi-lens array focuses an incoming wavefront to a plurality of focal spots, the multi-lens array configured to form a staggered two-dimension diffraction pattern to substantially eliminate optical interference; and
a detector to detect the staggered two-dimension diffraction pattern.

18. The wavefront sensing apparatus of claim 17, wherein each lens of the multi-lens array has one of a square or a rectangular aperture.

19. The wavefront sensing apparatus of claim 18, wherein predetermined portions of the multi-lens array are modified to systematically off-set corresponding predetermined portions of the plurality of focal spots to form the staggered two-dimension diffraction pattern.

20. The wavefront sensing apparatus of claim 19, further comprising:
a plurality of optical prisms, each optical prism being individually attached to each lens of the predetermined portions of the multi-lens array.

21. The wavefront sensing apparatus of claim 19, further comprising:
an optical prism assembly collectively attached to the multi-lens array.

22. The wavefront sensing apparatus of claim 19, wherein the predetermined portions of the multi-lens array diagonally shift the corresponding predetermined portions of the plurality of focal spots.

23. The wavefront sensing apparatus of claim 19, wherein the predetermined portions of the multi-lens array orthogonally shift the corresponding predetermined portions of the plurality of focal spots.

24. An object on which an image has been formed by the wavefront sensing apparatus of claim 17.

25. A projection lens assembly comprising the wavefront sensing apparatus of claim 17.

26. A lithography system comprising the wavefront sensing apparatus of claim 17.

27. A wavefront sensing apparatus having a multi-lens array to focus an incoming wavefront to form a plurality of focal spots, and a detector to detect the plurality of focal spots, the apparatus comprising:
a plurality of optical prisms attached to predetermined portions of the multi-lens array, so that corresponding predetermined portions of the plurality of focal spots are systematically off-set to form a staggered diffraction pattern on the detector.

28. The wavefront sensing apparatus of claim 27, wherein each lens of the multi-lens array has one of a square and a rectangular aperture.

29. The wavefront sensing apparatus of claim 28, wherein the predetermined portions of the multi-lens array diagonally shift the corresponding predetermined portions of the plurality of focal spots.

30. The wavefront sensing apparatus of claim 28, wherein the predetermined portions of the multi-lens array orthogonally shift the corresponding predetermined portions of the plurality of focal spots.

31. An object on which an image has been formed by the wavefront sensing apparatus of claim 27.

32. A projection lens assembly comprising the wavefront sensing apparatus of claim 27.

33. A lithography system comprising the wavefront sensing apparatus of claim 27.

34. A method for reducing optical interference in a wavefront sensor, the method comprising:
providing a multi-lens array comprising at least one optical prism associated with a respective lens; and
focusing an incoming wavefront with the multi-lens array to form a plurality of focal spots having off-set portions, wherein the plurality of focal spots forms a staggered two-dimension diffraction pattern.

35. The method of claim 34, wherein the at least one optical prism comprises a plurality of optical prisms, each optical prism being individually attached to a respective lens of the multi-lens array.

36. The method of claim 34, wherein the at least one optical prism comprises an optical prism assembly collectively attached to the multi-lens array.

* * * * *

UNITED STATES PATENT AND TRADEMARK OFFICE
CERTIFICATE OF CORRECTION

PATENT NO.     : 6,577,447 B1                                                      Page 1 of 1
DATED          : June 10, 2003
INVENTOR(S)    : Chia-Yu Ai et al.

It is certified that error appears in the above-identified patent and that said Letters Patent is hereby corrected as shown below:

Title page,
Item [57], ABSTRACT,
Line 5, "to a multiple" should read -- to multiple --.

Column 11,
Line 46, "step of further" should read -- step further --.

Signed and Sealed this

Twenty-third Day of September, 2003

JAMES E. ROGAN
*Director of the United States Patent and Trademark Office*